United States Patent
Miyazaki et al.

(10) Patent No.: US 9,301,407 B2
(45) Date of Patent: Mar. 29, 2016

(54) METHOD OF MANUFACTURING SUBSTRATE HAVING CAVITY

(71) Applicant: TAIYO YUDEN CO., LTD., Tokyo (JP)

(72) Inventors: Masashi Miyazaki, Tokyo (JP); Yuichi Sugiyama, Tokyo (JP); Tatsuro Sawatari, Tokyo (JP); Hideki Yokota, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 167 days.

(21) Appl. No.: 14/316,382

(22) Filed: Jun. 26, 2014

(65) Prior Publication Data

US 2015/0010694 A1    Jan. 8, 2015

(30) Foreign Application Priority Data

Jul. 3, 2013 (JP) ................................ 2013-140101

(51) Int. Cl.
*B05D 5/12* (2006.01)
*H05K 3/46* (2006.01)
(Continued)

(52) U.S. Cl.
CPC ............ *H05K 3/4697* (2013.01); *H05K 3/4647* (2013.01); *B05D 3/12* (2013.01); *B05D 5/12* (2013.01); *H05K 1/185* (2013.01); *H05K 3/007* (2013.01); *H05K 3/0044* (2013.01); *H05K 3/0094* (2013.01); *H05K 3/04* (2013.01); *H05K 3/06* (2013.01); *H05K 3/30* (2013.01);

(58) Field of Classification Search
USPC .............................................. 427/97.2–97.8
See application file for complete search history.

(56) References Cited

U.S. PATENT DOCUMENTS

| 6,172,423 B1 | 1/2001 | Lee |
| 2004/0001661 A1 | 1/2004 | Iwaki et al. |

(Continued)

FOREIGN PATENT DOCUMENTS

| JP | H11-220088 A | 8/1999 |
| JP | 2004-335726 A | 11/2004 |

(Continued)

OTHER PUBLICATIONS

Taiwanese Office Action dated Sep. 9, 2015 in a counterpart Taiwanese patent application No. 103121099. (Partial translation of the Office Action is attached as a concise explanation of relevance.).

(Continued)

*Primary Examiner* — Brian K Talbot
(74) *Attorney, Agent, or Firm* — Chen Yoshimura LLP

(57) ABSTRACT

The method of manufacturing a substrate includes: forming a penetrating hole in a base layer; inserting a metal dummy part in the penetrating hole; forming an insulating portion made of synthetic resin to fill a ring-shaped gap between the penetrating hole and the dummy part; forming lower insulating layers, covering the bottom surface of the dummy part, that are made of synthetic resin on the bottom surface of the base layer to be continuous with the insulating portion; forming upper insulating layers, covering the top surface of the dummy part, that are made of synthetic resin on the top surface of the base layer to be continuous with the insulating portion; forming an exposing hole by routing in the upper insulating layers to expose the top surface of the dummy part; and forming a cavity by removing the dummy part exposed through the exposing hole by etching.

12 Claims, 11 Drawing Sheets

(51) Int. Cl.
*H05K 3/44* (2006.01)
*B05D 3/12* (2006.01)
*H05K 3/00* (2006.01)
*H05K 3/04* (2006.01)
*H05K 3/30* (2006.01)
*H05K 3/42* (2006.01)
*H05K 3/06* (2006.01)
*H05K 1/18* (2006.01)

(56) References Cited

U.S. PATENT DOCUMENTS

2009/0154122 A1    6/2009    Makamura
2011/0048788 A1*   3/2011    Wang ................ H01L 21/76898
                                                            174/262
2011/0290408 A1*  12/2011    Samejima .............. H05K 3/445
                                                            156/182

FOREIGN PATENT DOCUMENTS

JP    2012-49196 A      3/2012
TW    200404487 A       3/2004
WO    2008/020478 A1    2/2008

OTHER PUBLICATIONS

Japanese Office Action dated Jan. 8, 2014, in a counterpart Japanese patent application No. 2013-140101.
Japanese Office Action dated Apr. 2, 2014, in a counterpart Japanese patent application No. 2013-140101.

* cited by examiner

METHOD OF MANUFACTURING SUBSTRATE HAVING CAVITY

BACKGROUND OF THE INVENTION

1. Field of the Invention

The present invention relates to a method of manufacturing a substrate having a cavity (recess) for installing an electronic component therein.

2. Description of Related Art

With mobile devices such as mobile phones and smartphones having a smaller profile, there is strong demand for reducing the thickness of the substrate having an electronic component installed therein, and one method of realizing reduced thickness is to provide a cavity (recess) (refer to Patent Document 1 below, for example). That is, by installing an electronic component inside the cavity, it is possible to reduce the thickness of the substrate having installed therein the electronic component.

Examples of methods to provide the substrate with a cavity include: (M1) forming a cavity by mechanical cutting; (M2) forming a cavity by chemical etching; and (M3) forming a cavity by stacking a plurality of layers having penetrating holes already formed therein on a base layer an adhesive therebetween, the plurality of penetrating holes integrally forming a continuous cavity.

The previously mentioned method M1 can be performed whether the material in which the cavity is to be formed is metal or synthetic resin. However, if the cavity is formed such that the thickness below the bottom surface is very thin (100 µm or less, for example) then there is a risk that stress resulting from cutting will result in damage such as cracking in the bottom surface. Also, cutting involves a dimensional tolerance of at least ±tens of µm, and thus, there is a tendency for variation to occur in the cross-sectional dimensions and depth of the cavity, and it is difficult to create a cavity with smooth inner walls and bottom surface.

The method M2 allows for higher precision (dimensional tolerance of ±less than 10 µm) than the method M1. However, if the material to be etched is synthetic resin, the time taken to etch is generally longer than if the material were metal. Also, the etchant used for the synthetic resin generally depends on the type of synthetic resin, but this method is unrealistic due to some types of resins (such as epoxy resin) requiring dangerous substances such as concentrated sulfuric acid or chromic acid.

The method M3 does not require the types of processes performed in the method M1 or the method M2. However, it is difficult for the cross-sectional dimensions of the penetrating holes formed in the respective layers to match perfectly, and it is difficult to stack the respective layers such that the penetrating holes align without being offset, and thus variation tends to occur in the cross-sectional dimensions of the cavity, which makes it difficult to have a cavity with smooth inner walls. Also, if an adhesive is used when stacking the respective layers, there is a risk that some of the adhesive seeps out to the bottom surface of the cavity when the layers are stacked, which results in variation in depth of the cavity or loss of smoothness in the bottom surface.

RELATED ART DOCUMENT

Patent Document

Patent Document 1: Japanese Patent Application Laid-Open Publication No. H11-220088

SUMMARY OF THE INVENTION

An object of the present invention is to provide a method of manufacturing a substrate having a cavity that is not susceptible to variation in cross-sectional dimensions and depth of the cavity while maintaining smoothness of the inner walls and bottom surface.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of manufacturing a substrate having a cavity for installing an electronic part therein, including: forming a penetrating hole for inserting a dummy part made of metal, the penetrating hole penetrating through a base layer; inserting the dummy part in the penetrating hole such that a ring-shaped gap is formed between an inner wall of the penetrating hole and an outer wall of the dummy part; filling the ring-shaped gap with an insulating portion made of synthetic resin; forming a lower insulating layer made of synthetic resin onto a bottom surface of the base layer so as to cover a bottom surface of the dummy part and so as to be continuous with the insulating portion; forming an upper insulating layer made of synthetic resin onto a top surface of the base layer so as to cover a top surface of the dummy part and so as to be continuous with the insulating portion; forming, by mechanical cutting, an exposing hole in either the upper insulating layer to expose the top surface or the lower insulating layer to expose the bottom surface of the dummy part; and chemically etching the dummy part so as to remove the dummy part exposed through the exposing hole, thereby forming said cavity.

According to the present invention, it is possible to provide a method of manufacturing a substrate having a cavity that is not susceptible to variation in cross-sectional dimensions and depth thereof while maintaining smoothness of the bottom surface.

The above-mentioned object and other objects of the present invention, features, and effects according to these respective objects shall be made clear by the explanation below and the accompanying drawings.

It is to be understood that both the foregoing general description and the following detailed description are exemplary and explanatory, and are intended to provide further explanation of the invention as claimed.

DETAILED DESCRIPTION OF THE PREFERRED EMBODIMENTS

<First Manufacturing Method>

Below, a method of manufacturing a substrate having a cavity including a metal base layer 11 (refer to FIG. 8) will be described with reference to FIGS. 1 to 8.

Figure 1:
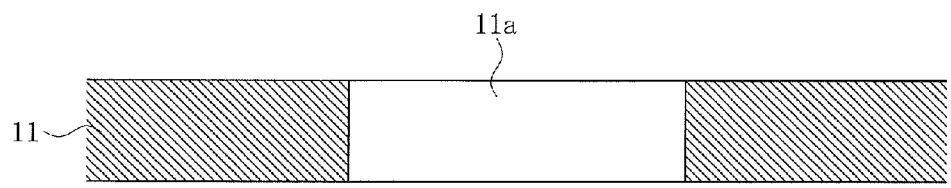
FIG. 1 is a drawing for describing a first manufacturing method.

First as shown in FIG. 1, the metal base layer 11 is prepared. The base layer 11 is made of copper or a copper alloy, and is 100 to 400 μm in thickness.

Next, as shown in FIG. 1, a penetrating hole 11a having a substantially rectangular cross-sectional shape is formed in the base layer 11. The penetrating hole 11a is formed by photoetching using a copper- or copper alloy-etchant (such as iron (III) chloride), or routing using a router (cutting tool).

Figure 2:
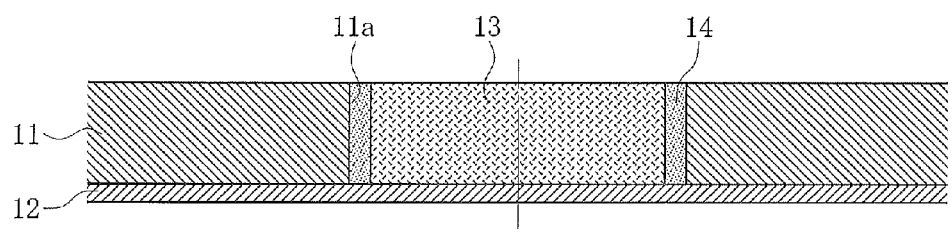
FIG. 2 is a drawing for describing the first manufacturing method.

Next, as shown in FIG. 2, after an adhesive sheet 12 is bonded onto the bottom surface of the base layer 11, a dummy part 13 is inserted into the penetrating hole 11a from the top surface of the base layer 11 so as to be concentric with the penetrating hole 11a, and the bottom surface of the dummy part 13 is bonded to the adhesive sheet 12. The dummy part 13 is made of copper or a copper alloy, has an equal thickness to the base layer 11, and has a substantially rectangular shape with a smaller cross-sectional shape than the penetrating hole 11a. The dummy part 13 corresponds to an electronic part EC to be mentioned later (refer to FIG. 8), and the cross-sectional shape thereof is similar to that of the electronic part EC but slightly larger.

Next, as shown in FIG. 2, an insulating portion 14 is formed so as to fill a ring-shaped gap (no reference character assigned) between the inner wall of the penetrating hole 11a and the outer wall of the dummy part 13. The insulating portion 14 is made of a material having a reinforcing filler made from an epoxy resin, or a polyimide or bismaleimide-triazine resin, or from material that includes this and silicon dioxide or the like, and the thickness of the insulating portion 14 is 30 to 200 μm. The insulating portion 14 may be made of the same material as an insulating layer 15, an insulating layer 16, an insulating layer 19, and an insulating layer 20 to be mentioned later, or of a different material. The insulating portion 14 is formed by filling the ring-shaped gap between the inner wall of the penetrating hole 11a and the outer wall of the dummy part 13 with a material for the insulating portion 14 that has not yet been cured (prepreg material), and then this material undergoes heat treatment to be cured.

Figure 3:
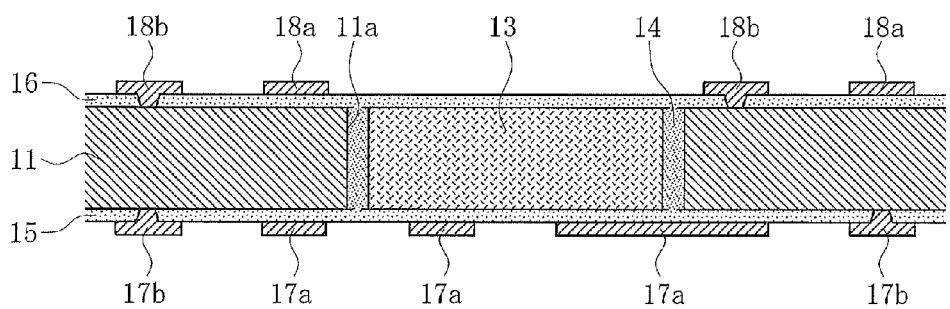
FIG. 3 is a drawing for describing the first manufacturing method.

Next, as shown in FIG. 3, after the adhesive sheet 12 is peeled off, an insulating layer 15 is formed on the bottom surface of the base layer 11 so as to cover the bottom surface of the dummy part 13 and to be continuous with the bottom end of the insulating portion, and an insulating layer 16 is formed on the top surface of the base layer 11 so as to cover the top surface of the dummy part 13 and to be continuous with the top end of the insulating portion 14. The insulating layer 15 and the insulating layer 16 are made of a material including a reinforcing filler made from an epoxy resin, or a polyimide or bismaleimide-triazine resin, or from material that includes this and silicon dioxide or the like, and the thickness thereof is 10 to 30 μm. The insulating layer 15 and the insulating layer 16 are generally made of the same material. The insulating layer 15 and the insulating layer 16 are formed by bonding sheet-shaped materials made of a material for the insulating layer 15 and the insulating layer 16 that has not yet been cured (prepreg) onto the top surface and the bottom surface of the base layer 11, and then subjecting the sheet-shaped materials to heat treatment to cure them.

Next, as shown in FIG. 3, on the bottom surface of the insulating layer 15, signal wiring lines 17a and ground wiring lines 17b are formed, and on the top surface of the insulating layer 16, signal wiring lines 18a and ground wiring lines 18b are formed. The signal wiring lines 17a, the ground wiring lines 17b, the signal wiring lines 18a, and the ground wiring lines 18b are made of copper or a copper alloy, and the thickness thereof is 5 to 25 μm. Each ground wiring line 17b has a via (no reference character assigned) that is integrally formed therewith, that penetrates the insulating layer 15 and that is electrically connected to the base layer 11, and each ground wiring line 18b has a via (no reference character assigned) that is integrally formed therewith, that penetrates the insulating layer 16, and that is electrically connected to the base layer 11. The base material for the wiring lines having the vias is formed by perforation by laser and electroplating, and two-dimensional patterning of the base material for the wiring lines (formation of the signal wiring lines 17a, the ground wiring lines 17b, the signal wiring lines 18a, and the ground wiring lines 18b) is performed by photoetching using a copper- or copper alloy-etchant (such as iron (III) chloride). The etchant used here does not react with the insulating layer 15 or the insulating layer 16, and thus, changes in properties, surface roughening, and the like do not occur in the insulating layer 15 or the insulating layer 16 during photoetching.

Figure 4:
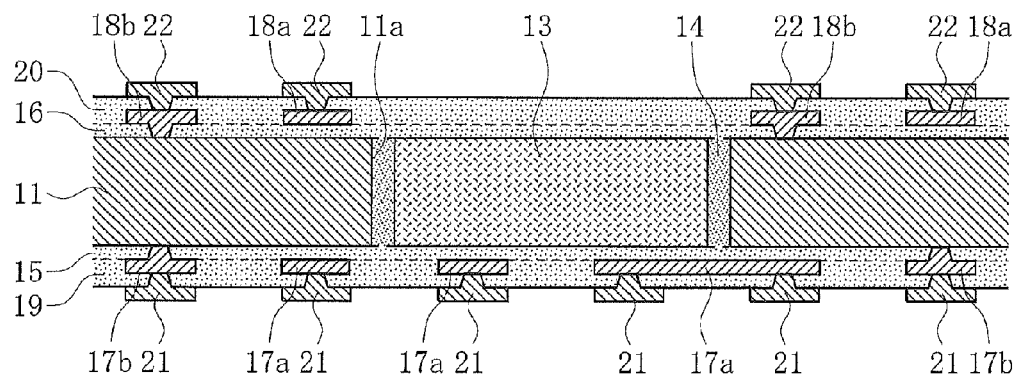
FIG. 4 is a drawing for describing the first manufacturing method.

Next, as shown in FIG. 4, an insulating layer 19 is formed on the bottom surface of the insulating layer 15 so as to cover the signal wiring lines 17a and the ground wiring lines 17b, and an insulating layer 20 is formed on the top surface of the insulating layer 16 so as to cover the signal wiring lines 18a and the ground wiring lines 18b. The insulating layer 19 and the insulating layer 20 are made of a material including a reinforcing filler made from an epoxy resin, or a polyimide or bismaleimide-triazine resin, or from material that includes this and silicon dioxide or the like, and the thickness thereof is 10 to 30 µm. The insulating layer 19 and the insulating layer 20 are generally made of the same material as each other and as the insulating layer 15 and the insulating layer 16. The insulating layer 19 and the insulating layer 20 are formed by respectively bonding sheet-shaped materials made of a material for the insulating layer 19 and the insulating layer 20 that has not yet been cured (prepreg), and then subjecting the sheet-shaped materials to heat treatment to cure them.

Next, as shown in FIG. 4, connecting pads 21 are formed on the bottom surface of the insulating layer 19, and connecting pads 22 are formed on the top surface of the insulating layer 20. The connecting pads 21 and the connecting pads 22 are made of copper or a copper alloy, and the thickness thereof is 5 to 25 µm. Each connecting pad 21 has a via (no reference character assigned) that is integrally formed therewith, that penetrates the insulating layer 19, and that is electrically connected to a signal wiring line 17a or a ground wiring line 17b, and each connecting pad 22 has a via (no reference character assigned) that is integrally formed therewith, that penetrates the insulating layer 20, and that is electrically connected to a signal wiring line 18a or a ground wiring line 18b. The base material for the pads having the vias is formed by perforation by laser and electroplating, and two-dimensional patterning of the base material for the pads (formation of the connecting pads 21 and the connecting pads 22) is performed by photoetching using a copper- or copper alloy-etchant (such as iron (III) chloride). The etchant used here does not react with the insulating layer 19 or the insulating layer 20, and thus, changes in properties, surface roughening, and the like do not occur in the insulating layer 19 or the insulating layer 20 during photoetching.

Figure 5:
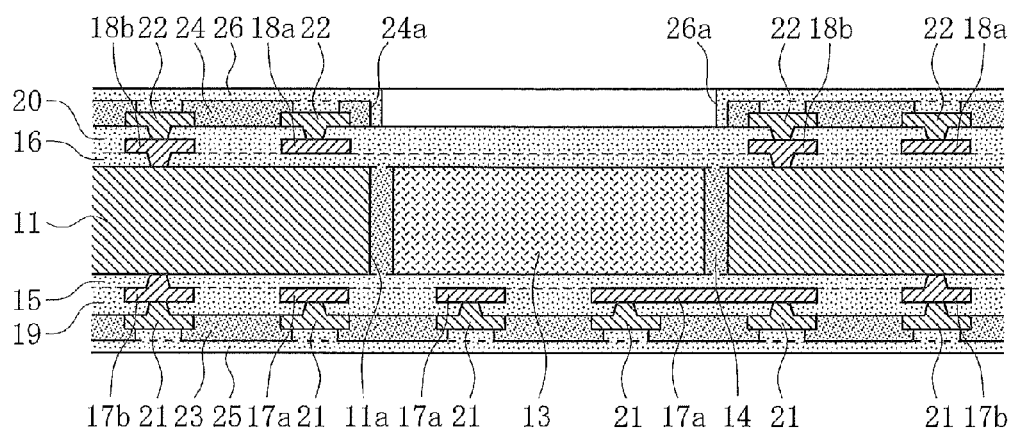
FIG. 5 is a drawing for describing the first manufacturing method.

Next, as shown in FIG. 5, a solder resist layer 23 is formed on the bottom surface of the insulating layer 19 so as to cover the connecting pads 21, and a solder resist layer 24 is formed on the top surface of the insulating layer 20 so as to cover the connecting pads 22. The solder resist layer 23 and the solder resist layer 24 are made of a material including a reinforcing filter made from an epoxy resin, an acrylic resin, or a polyimide or bismaleimide-triazine resin, or from material that includes this and silicon dioxide or the like, and the thicknesses thereof are 5 to 70 µm. The solder resist layer 23 has holes (no reference character assigned) to expose the centers of the bottom surfaces of the respective connecting pads 21, and the solder resist layer 24 has holes (no reference character assigned) to expose the centers of the top surfaces of the respective connecting pads 22. Also, the solder resist layer 24 has formed therein a substantially rectangular hole 24a having a substantially equal cross-sectional shape as the penetrating hole 11a, and the hole 24a is formed over the penetrating hole 11a. The solder resist layer 23 and the solder resist layer 24 are formed by vacuum lamination or photoetching.

Next, as shown in FIG. 5, an etching resist layer 25 is formed so as to cover the solder resist layer 23 and an etching resist layer 26 is formed so as to cover the solder resist layer 24. The etching resist layer 25 and the etching resist layer 26 are made of a material including a reinforcing filter made from an epoxy resin, an acrylic resin, or a polyimide or bismaleimide-triazine resin, or from material that includes this and silicon dioxide or the like, and the thicknesses thereof are 5 to 75 µm. Also, the etching resist layer 26 has a hole 26a with a substantially rectangular shape slightly smaller than the cross-sectional shape of the hole 24a of the solder resist 24, the hole 26a being inside the hole 24a of the solder resist 24. The etching resist layer 25 and the etching resist layer 26 are formed by vacuum lamination or photoetching.

Figure 6:
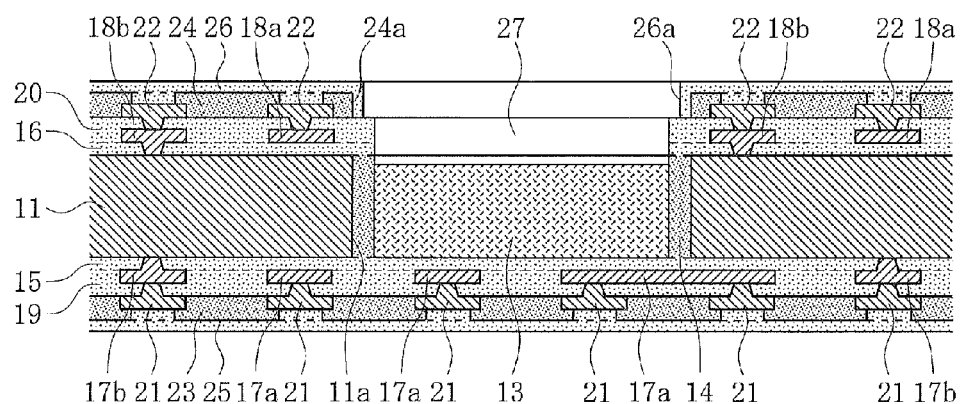
FIG. 6 is a drawing for describing the first manufacturing method.

Next, as shown in FIG. 6, an exposing hole 27 for exposing the top surface of the dummy part 13 is formed in one portion of the insulating layer 20 and one portion of the insulating layer 16 therebelow, which are exposed through the hole 26a in the etching resist layer 26. The exposing hole 27 is formed by routing using a router (cutting tool). In order to completely expose the top surface of the dummy part 13, it is preferable that the bottom of the exposing hole 27 partially penetrate the dummy part 13 (refer to FIG. 6).

Figure 7:
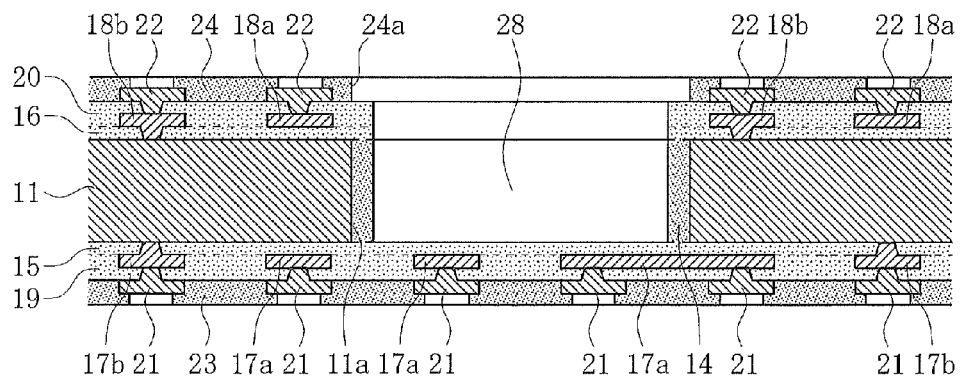
FIG. 7 is a drawing for describing the first manufacturing method.

Next, as shown in FIG. 7, the dummy part 13 exposed through the exposing hole 27 is removed, thus forming a cavity (recess) 28 having a depth that reaches from the top surface of the insulating layer 15 to the top surface of the insulating layer 20, and having the same cross-sectional shape as the dummy part 13. The removal of the dummy part 13 is performed by etching using a copper- or copper alloy-etchant (such as iron (III) chloride). Here, the etchant naturally does not react with the etching resist layer 25 or the etching resist layer 26, and also does not react with the insulating portion 14, the insulating layer 15, the insulating layer 16, or the insulating layer 20, and thus, changes in properties, surface roughening, and the like do not occur in the insulating portion 14, the insulating layer 15, the insulating layer 16, or the insulating layer 20 during etching.

Next, as shown in FIG. 7, the etching resist layer 25 and the etching resist layer 26 are removed. The removal of the etching resist layer 25 and the etching resist layer 26 is performed by a removal processes using resist removal fluid such as sodium hydroxide or an amine solution.

Figure 8:
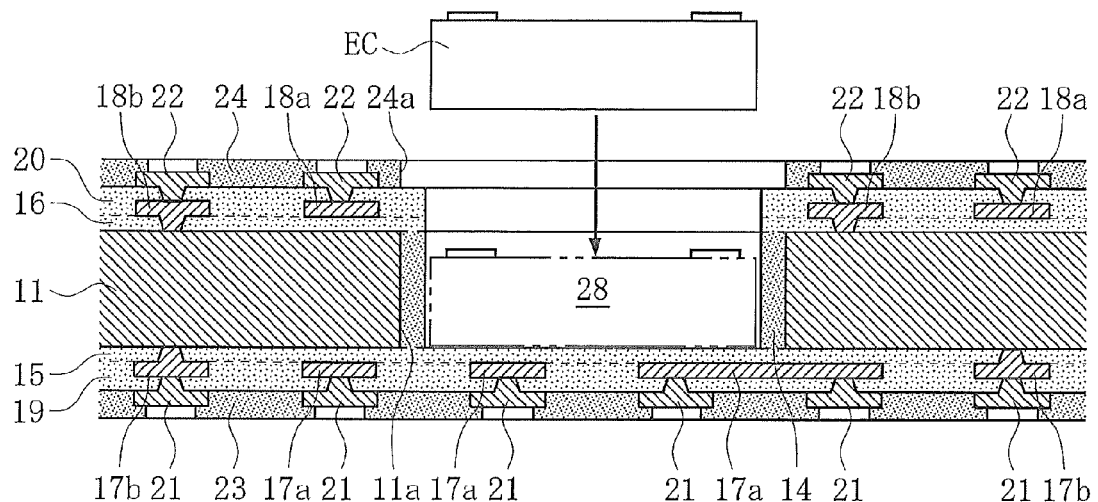
FIG. 8 is a cross-sectional view of a substrate having a cavity manufactured by the first manufacturing method.

The substrate with a cavity shown in FIG. 8 is manufactured as described above. The substrate with a cavity has a cavity 28 for installing therein an electronic part EC such as an IC chip or an imaging element, and thus, by installing the electronic part EC in the cavity 28 by, for example, coating the bottom surface of the cavity 28 or the bottom surface of the electronic part EC with an adhesive and then mounting the electronic part EC on the bottom surface of the cavity 28, it is possible to have a reduced substrate thickness after the electronic part EC is installed.

According to the first manufacturing method described above, the exposing hole 27 for exposing the top surface of the dummy part 13 is formed in the upper insulating layers (insulating layer 16 and insulating layer 20) by routing, that is, mechanical cutting. However, the cutting depth is shallow, and almost the entire dummy part 13 below the exposing hole 27 remains, and thus, damage such as cracking due to stress from the cutting process does not occur. In addition, the cavity 28 is formed by removing the dummy part 13 exposed through the exposing hole 27 by etching, that is chemical etching, and thus, the cross-sectional dimensions and depth of the cavity 28 are not susceptible to variation, and also, the smoothness of the inner wall and the bottom surface can be reliably maintained.

That is, it is possible form the cavity 28 into which it is possible to insert the electronic part EC smoothly, and to mount the electronic part EC onto the bottom surface in a stable manner. Also, it is possible to form the cavity 28 to the maximum depth regardless of the thickness of the substrate, and thus, it is possible to make the substrate having the electronic part EC installed therein as thin as possible.

Also, according to the first manufacturing method, the dummy part 13 has a cross-sectional shape similar to but slightly larger than the cross-sectional shape of the electronic part EC, and thus, it is possible to form the cavity 28 to have a cross-sectional shape similar to but slightly larger than that of the electronic part EC. In other words, it is possible to form the cavity 28 into which the electronic part EC can be inserted in a smoother manner.

Modification Examples of First Manufacturing Method

Below, modification examples of the first manufacturing method described above will be described.

Modification Example 1

Figure 9:
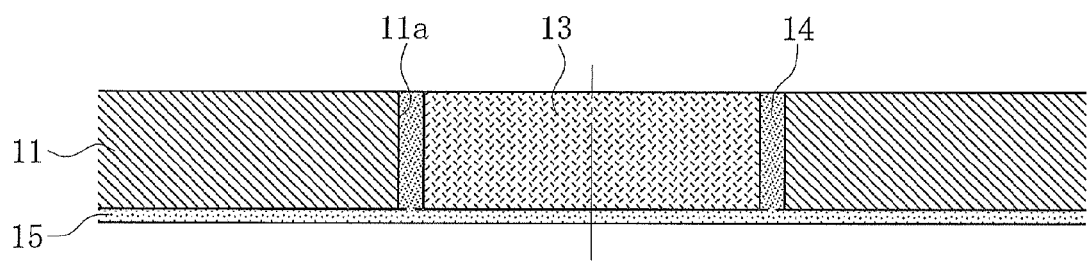
FIG. 9 is a drawing for describing Modification Example 1 of the first manufacturing method.

In the first manufacturing method, a step of bonding an adhesive sheet 12 on the bottom surface of the base layer 11 was used (refer to FIG. 2), but as shown in FIG. 9, a sheet-shaped material made of a material for the insulating layer 15 that has not yet been cured may be bonded on the bottom surface of the base layer 11 instead of the adhesive sheet 12, with the sheet-shaped material being cured by heat treatment after the bottom surface of the dummy part 13 inserted in the penetrating hole 11a is bonded to the sheet-shaped material. In this manner, it is possible to omit the aforementioned step.

Modification Example 2

Figure 10:
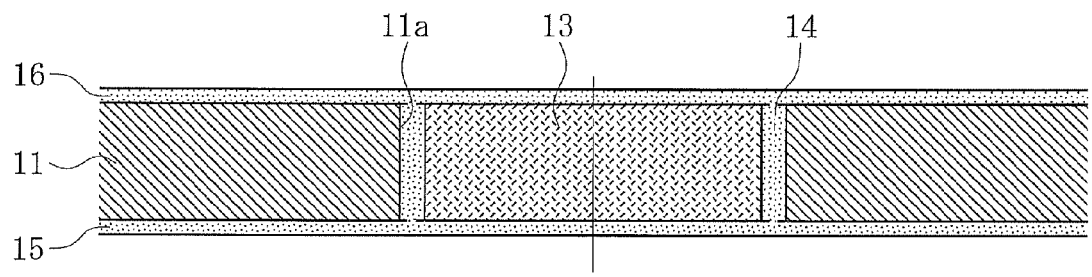
FIG. 10 is a drawing for describing Modification Example 2 of the first manufacturing method.

In the first manufacturing method, a step is used in which a ring-shaped gap between the inner wall of the penetrating hole 11a and the outer wall of the dummy part 13 is filled with a material for the insulating portion 14 that has not yet been cured (refer to FIG. 2), but as shown in FIG. 10, the process may be performed such that a sheet-shaped material made of a material for the insulating layer 15 that has not yet been cured is bonded to the bottom surface of the base layer 11 and the bottom surface of the dummy part 13 inserted in the penetrating hole 11a is bonded to the sheet-shaped material, and then a sheet-shaped material made of a material for the insulating layer 16 that has not yet been cured is bonded to the top surface of the base layer 11, and then at least one of the two sheet-shaped members is pressed towards the base layer 11 such that a portion thereof fills the ring-shaped gap, the remaining portion thereof being left in a layer form on at least one of the top surface and bottom surface of the base layer 11. In this manner, it is possible to omit the aforementioned step and form the insulating layer 15 and the insulating layer 16 at the same time.

Modification Example 3

In the first manufacturing method, wiring lines (signal wiring lines 17a and ground wiring lines 17b) are provided in the lower insulating layers (insulating layer 15 and insulating layer 19), and wiring lines (signal wiring lines 18a and ground wiring lines 18b) are provided in the upper insulating layers (insulating layer 16 and insulating layer 20), but the wiring lines may be provided only in either of the lower insulating layers and the upper insulating layers. Alternatively, wiring lines may be present in two or more layers by adding the step of forming the insulating layers and the step of forming the wiring lines.

Modification Example 4

In the first manufacturing method, the dummy part 13 is made of copper or a copper alloy (refer to FIG. 2), but even if the dummy part 13 were made of a metal other than copper or a copper alloy such as nickel or a nickel alloy, for example, if an etchant appropriate to removing such metal is used in the step of removing the dummy part described in FIG. 7, a similar step of removing the dummy part can be performed.

Modification Example 5

Figure 11:
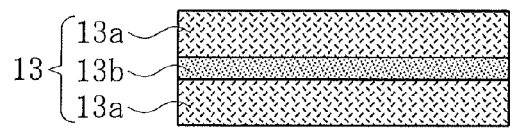
FIG. 11 is a drawing for describing Modification Example 5 of the first manufacturing method.
Figure 12:
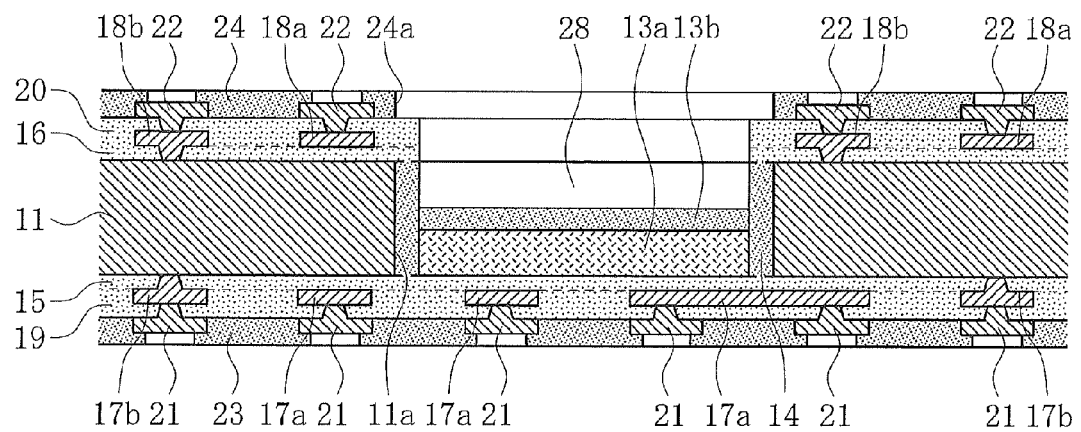
FIG. 12 is a drawing for describing Modification Example 5 of the first manufacturing method.

In the first manufacturing method, a case in which the entire dummy part 13 is made of metal (refer to FIG. 2) was described, but a configuration may alternatively be used in which the dummy part 13 shown in FIG. 11 is used, that is, a dummy part 13 in which an etching resist layer 13b (made of the same material as the etching resist layers 25 and 26) is interposed between two metal blocks 13a, each of which fulfills the same role as the dummy part. If the dummy part 13 shown in FIG. 11 is used, it is possible to form a shallow cavity 28 as in the substrate with a cavity shown in FIG. 12 with the same steps as the first manufacturing method.

Modification Example 6

Figure 13:
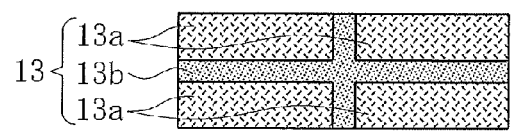
FIG. 13 is a drawing for describing Modification Example 6 of the first manufacturing method.
Figure 14:
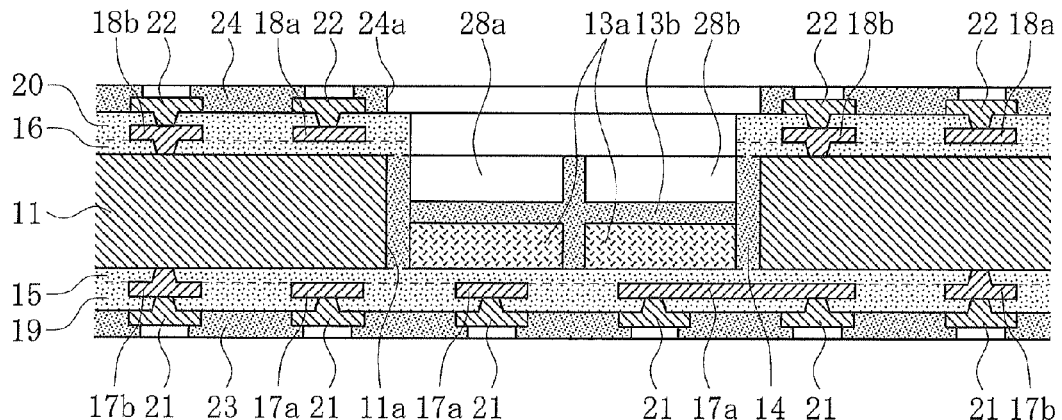
FIG. 14 is a drawing for describing Modification Example 6 of the first manufacturing method.
Figure 15:
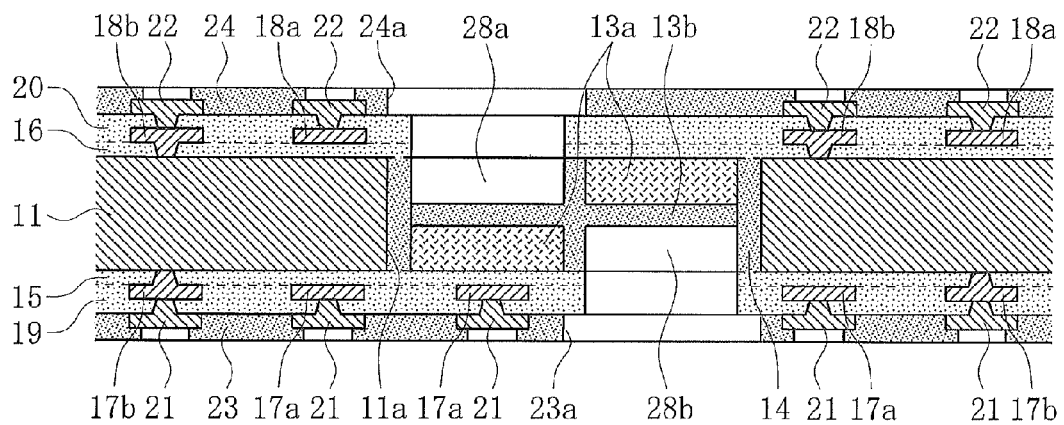
FIG. 15 is a drawing for describing Modification Example 6 of the first manufacturing method.

In the first manufacturing method, a case in which the entire dummy part 13 is made of metal (refer to FIG. 2) was described, but a configuration may alternatively be used in which the dummy part 13 shown in FIG. 13 is used, that is, a dummy part 13 in which etching resist layers 13b (made of the same material as the etching resist layer 25) are interposed between four metal blocks 13a, each of which fulfills the same role as the dummy part. If the dummy part 13 shown in FIG. 13 is used, it is possible to form two shallow cavities 28a and 28b that are adjacent to each other as in the substrate with a cavity shown in FIG. 14 with the same steps as the first manufacturing method. Also, if the dummy part 13 shown in FIG. 13 is used, two cavities 28a and 28b having a shallow depth as in the substrate with a cavity shown in FIG. 15 can be formed on the top surface and bottom surface of the substrate by substantially the same steps as the first manufacturing method.

<Second Manufacturing Method>

A method of manufacturing a substrate with a cavity including a synthetic resin base layer 31 (refer to FIG. 22) will be described below with reference to FIGS. 16 to 22.

Figure 16:
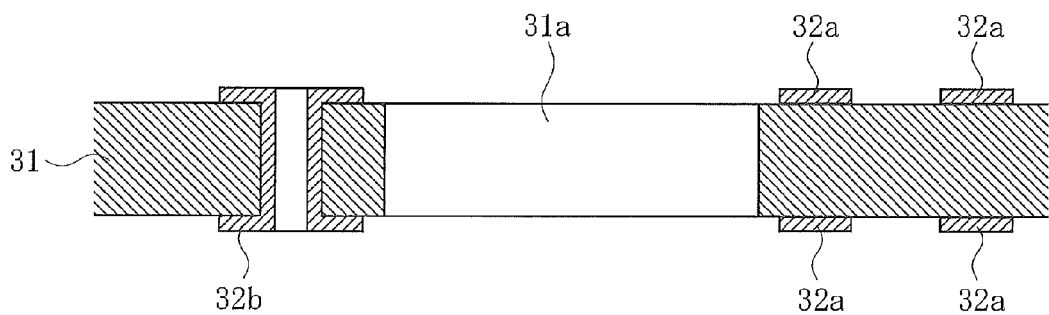
FIG. 16 is a drawing for describing a second manufacturing method.

As shown in FIG. 16, the synthetic resin base layer 31 is prepared. The base layer 31 is made of a material including a reinforcing filler made of an epoxy resin, or a polyimide or bismaleimide-triazine resin, or from material that includes this and silicon dioxide or the like, and the thickness of the base layer 31 is 100 to 400 μm.

As can be seen in FIG. 16, signal wiring lines 32a are provided on the top surface and bottom surface of the base layer 31, and a cylindrical via 32b for grounding is provided so as to penetrate the base layer 31. The signal wiring lines 32a and the cylindrical via 32b are made of copper or a copper alloy, and the thickness thereof is 5 to 25 μm. The base material for the wiring lines is formed by perforation by laser and electroplating, and two-dimensional patterning of the base material for the wiring lines (formation of the signal wiring lines 32 and the flange portion of the cylindrical via 32b) is performed by photoetching using a copper- or copper alloy-etchant (such as iron (III) chloride). The etchant used here does not react with the base layer 31, and thus, changes in properties, surface roughening, or the like does not occur in the base layer 31 during photoetching.

Next, as shown in FIG. 16, a penetrating hole 31a having a substantially rectangular cross-sectional shape is formed in the base layer 31. The penetrating hole 31a is formed by routing using a router (cutting tool).

Figure 17:
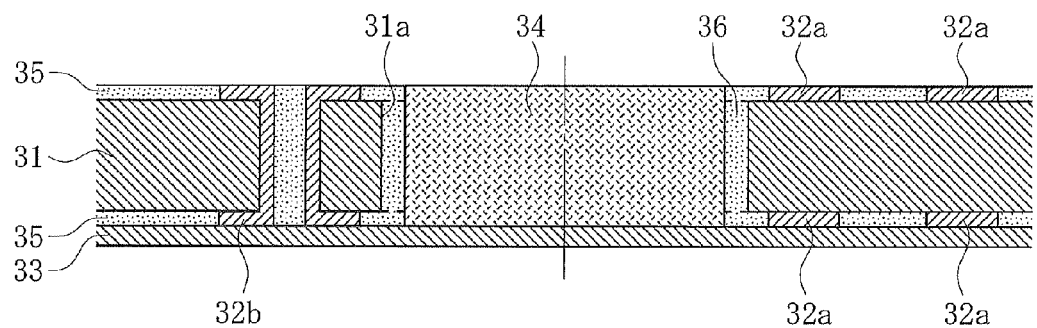
FIG. 17 is a drawing for describing the second manufacturing method.

Next, as shown in FIG. 17, an adhesive sheet 33 is bonded onto the bottom surface of the signal wiring lines 32a and the cylindrical via 32b, and then, a dummy part 34 is inserted into the penetrating hole 31a from the top surface side of the base layer 31 so as to be concentric with the penetrating hole 31a, and the bottom surface of the dummy part 34 is bonded to the adhesive sheet 33. The dummy part 34 is made of copper or a copper alloy, and the thickness thereof is equal to the distance from the bottom surface of the signal wiring lines 32a on the lower side to the top surface of the signal wiring lines 32a on the upper side, and the cross-sectional shape thereof is a substantially rectangular shape smaller than the cross-sectional shape of the penetrating hole 31a. The dummy part 34 corresponds to an electronic part EC to be mentioned later (refer to FIG. 22), and the cross-sectional shape thereof is similar to but slightly larger than that of the electronic part EC.

Next, as shown in FIG. 17, insulating layers 35 are formed on the top surface and bottom surface of the base layer 31, and an insulating portion 36 that fills a ring-shaped gap (no reference character assigned) between the inner wall of the penetrating hole 31a and the outer wall of the dummy part 34 is formed so as to be continuous with the insulating layers 35. The insulating layers 35 and the insulating portion 36 are made of a material including a reinforcing filler made of an epoxy resin, or a polyimide or bismaleimide-triazine resin, or from material that includes this and silicon dioxide or the like, and the thickness of the insulating layers 35 is equal to the thickness of the signal wiring lines 32a and the flange portions of the cylindrical via 32b, and the thickness of the insulating portion 36 is 30 to 200 μm. The insulating layers 35 and the insulating portion 36 are formed by bonding a sheet-shaped material made of the material for the insulating layers 35 and the insulating portion 36 that has not yet been cured (prepreg) onto the top surface of the base layer 31, pressing the sheet-shaped material towards the base layer 31 and pushing a portion thereof through the ring-shaped gap between the inner wall of the penetrating hole 31a and the outer wall of the dummy part 34 and through the inner hole of the cylindrical via 32b, leaving remaining the material on the top surface and the bottom surface of the base layer 31 in layer shapes, and then curing the material by heat treatment.

Figure 18:
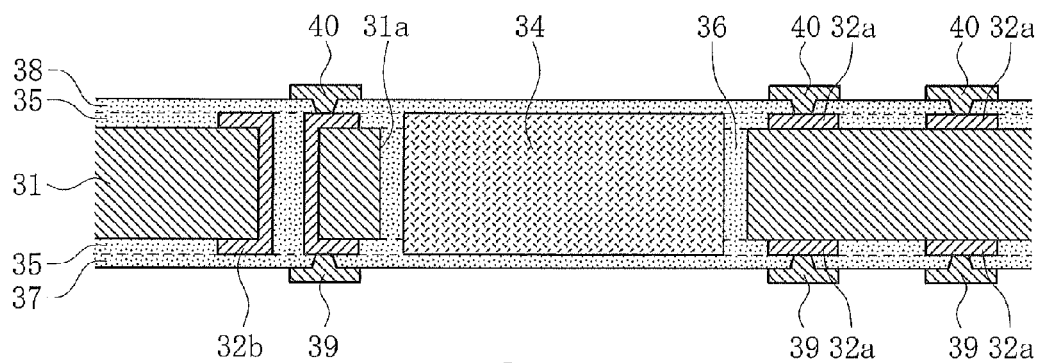
FIG. 18 is a drawing for describing the second manufacturing method.

Next, as shown in FIG. 18, the bonding sheet 33 is removed, and an insulating layer 37 is formed on the bottom surface of the insulating layer 35 on the lower side so as to cover the bottom surface of the dummy part 34, and the bottom surfaces of the signal wiring lines 32a, and the cylindrical via 32b, and then, an insulating layer 38 is formed on the top surface of the insulating layer 35 on the upper side so as to cover the top surface of the dummy part 34 and the top surfaces of the signal wiring lines 32a and the cylindrical via 32b. The insulating layer 37 and the insulating layer 38 are made of a material including a reinforcing filler made from an epoxy resin, or a polyimide or bismaleimide-triazine resin, or from material that includes this and silicon dioxide or the like, and the thickness thereof is 10 to 30 μm. The insulating layer 37 and the insulating layer 38 are generally made of the same material as each other and as the insulating layers 35. The insulating layer 37 and the insulating layer 38 are formed by respectively bonding sheet-shaped materials made of a material for the insulating layer 37 and the insulating layer 38 that has not yet been cured (prepreg), and then subjecting the sheet-shaped materials to heat treatment to cure them.

Next, as shown in FIG. 18, connecting pads 39 are formed on the bottom surface of the insulating layer 37 and connecting pads 40 are formed on the top surface of the insulating layer 38. The connecting pads 39 and the connecting pads 40 are made of copper or a copper alloy, and the thickness thereof is 5 to 25 μm. Each connecting pad 39 has a via integrally formed therewith (no reference character assigned) that penetrates the insulating layer 37 and that is electrically connected to a signal wiring line 32a or a cylindrical via 32b, and each connecting pad 40 has a via integrally formed therewith (no reference character assigned) that penetrates the insulating layer 39 and that is electrically connected to a signal wiring line 32a or the cylindrical via 32b. The base material for the pads having the vias is formed by perforation by laser and electroplating, and two-dimensional patterning of the base material for the pads (formation of the connecting pads 39 and the connecting pads 40) is performed by photoetching using a copper- or copper alloy etchant (such as iron (III) chloride). The etchant used here does not react with the insulating layer 37 or the insulating layer 38, and thus, changes in properties, surface roughening, and the like do not occur in the insulating layer 37 and the insulating layer 38 during photoetching.

Figure 19:
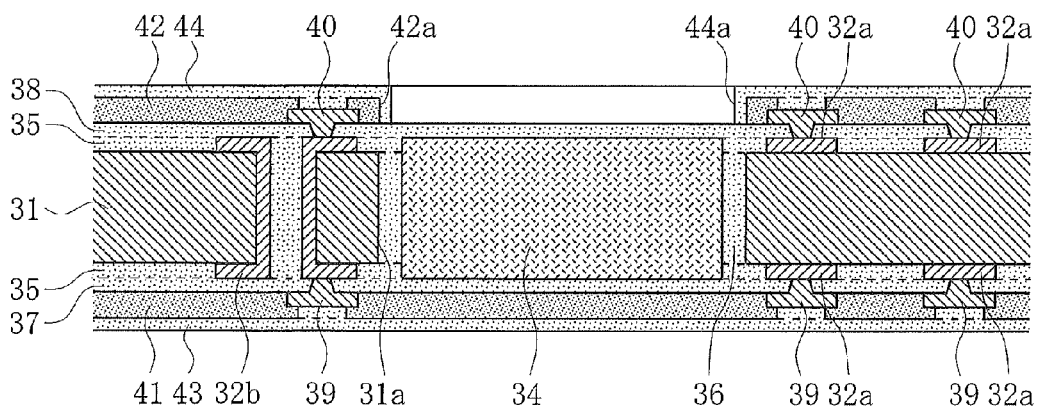
FIG. 19 is a drawing for describing the second manufacturing method.

Next, as shown in FIG. 19, a solder resist layer 41 is formed on the bottom surface of the insulating layer 37 so as to cover the connecting pads 39, and a solder resist layer 42 is formed on the top surface of the insulating layer 38 so as to cover the connecting pads 40. The solder resist layer 41 and the solder resist layer 42 are made of a material including a reinforcing filter made from an epoxy resin, an acrylic resin, or a polyimide or bismaleimide-triazine resin, or from material that includes this and silicon dioxide or the like, and the thicknesses thereof are 5 to 70 μm. The solder resist layer 41 has holes (no reference character assigned) to expose the centers of the bottom surfaces of the respective connecting pads 39, and the solder resist layer 42 has holes (no reference character assigned) to expose the centers of the top surfaces of the respective connecting pads 40. Also, the solder resist layer 42 has formed therein a substantially rectangular hole 42a having a substantially equal cross-sectional shape as the penetrating hole 31a, and the hole 42a is formed over the penetrating hole 31a. The solder resist layer 41 and the solder resist layer 42 are formed by vacuum lamination or photoetching.

Next, as shown in FIG. 19, an etching resist layer 43 is formed so as to cover the solder resist layer 41, and an etching resist layer 44 is formed so as to cover the solder resist layer 42. The etching resist layer 43 and the etching resist layer 44 are made of a material including a reinforcing filter made from an epoxy resin, an acrylic resin, or a polyimide or bismaleimide-triazine resin, or from material that includes this and silicon dioxide or the like, and the thicknesses thereof are 5 to 75 μm. Also, the etching resist layer 44 has a hole 44a with a substantially rectangular shape slightly smaller than the cross-sectional shape of the hole 42a of the solder resist 44, the hole 44a being inside the hole 42a of the solder resist 42. The etching resist layer 43 and the etching resist layer 44 are formed by vacuum lamination or photoetching.

Figure 20:
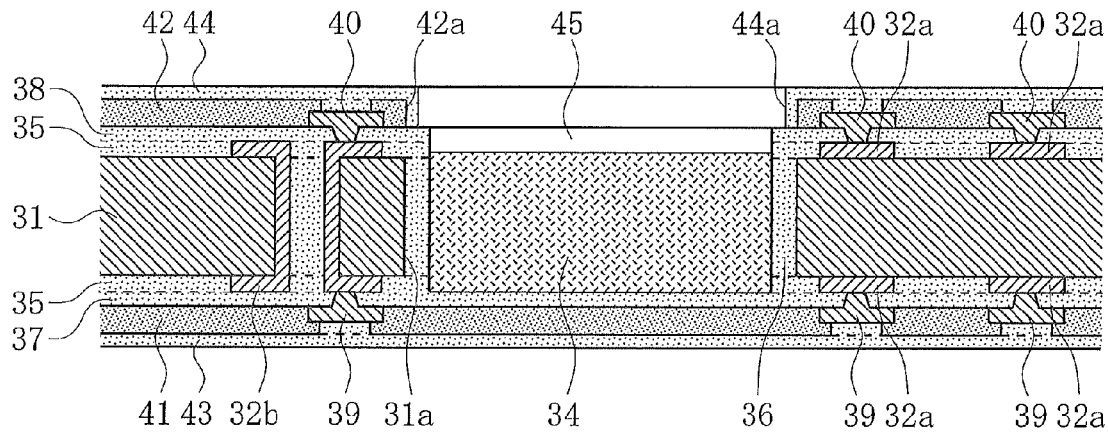
FIG. 20 is a drawing for describing the second manufacturing method.

Next, as shown in FIG. 20, an exposing hole 45 for exposing the top surface of the dummy part 34 is formed in a portion of the insulating layer 38 exposed by the hole 44a in the etching resist layer 44. The exposing hole 45 is formed by routing using a router (cutting tool). In order to completely expose the top surface of the dummy part 34, it is preferable that the bottom of the exposing hole 45 partially penetrate the dummy part 34 (refer to FIG. 20).

Figure 21:
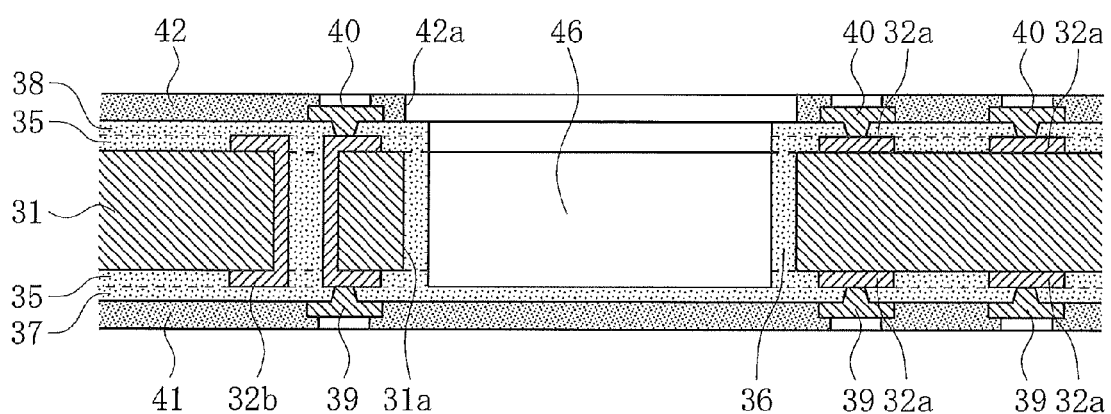
FIG. 21 is a drawing for describing the second manufacturing method.

Next, as shown in FIG. 21, the dummy part 34 exposed through the exposing hole 45 is removed, and a cavity (recess) 46 having a depth that reaches from the top surface of the insulating layer 37 to the top surface of the insulating layer 38, and having the same cross-sectional shape as the dummy part 34 is formed. The removal of the dummy part 34 is performed by etching using a copper- or copper alloy-etchant (such as iron (III) chloride). Here, the etchant naturally does not react with the etching resist layer 43 or the etching resist layer 44, and also does not react with the insulating portion 36, the insulating layer 35, the insulating layer 37, or the insulating layer 38, and thus, changes in properties, surface roughening, and the like do not occur in the insulating portion 36, the insulating layer 35, the insulating layer 37, or the insulating layer 38 during etching.

Next, as shown in FIG. 21, the etching resist layer 43 and the etching resist layer 44 are removed. The removal of the etching resist layer 43 and the etching resist layer 44 is performed by a removal processes using resist removal fluid such as sodium hydroxide or an amine solution.

Figure 22:
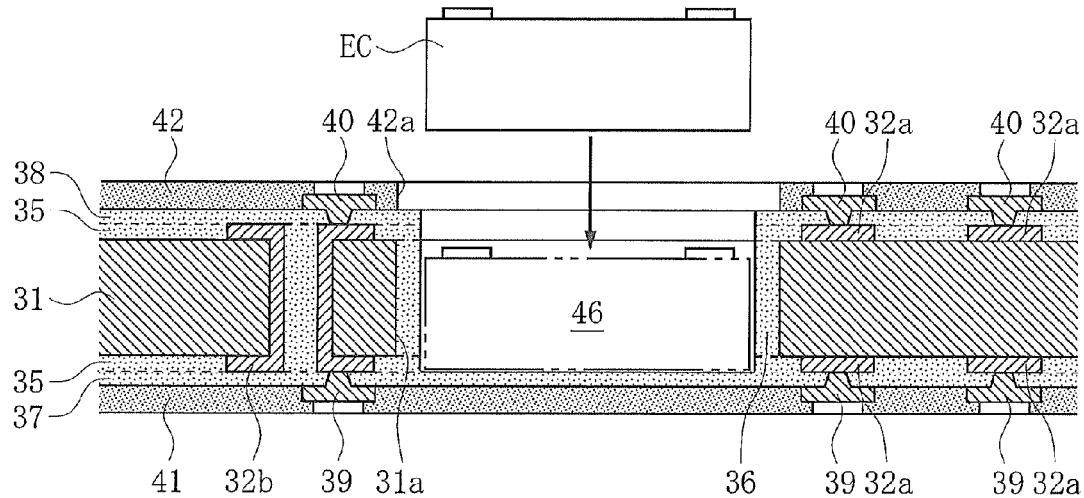
FIG. 22 is a cross-sectional view of a substrate having a cavity manufactured by the second manufacturing method.

The substrate with a cavity shown in FIG. 22 is manufactured as described above. The substrate with a cavity has a cavity 46 for installing therein an electronic part EC such as an IC chip or an imaging element, and thus, by installing the electronic part EC in the cavity 46 by, for example, coating the bottom surface of the cavity 46 or the bottom surface of the electronic part EC with an adhesive and then mounting the electronic part EC on the bottom surface of the cavity 46, it is possible to have a reduced substrate thickness after the electronic part EC is installed.

According to the second manufacturing method described above, the exposing hole 45 for exposing the top surface of the dummy part 34 is formed in the upper insulating layer (insulating layer 38) by routing, that is, mechanical cutting. However, because the cutting depth is shallow, and substantially the entire dummy part 34 remains below the exposing hole 45, damage such as cracking due to stress from cutting does not occur. In addition, the dummy part 34 exposed through the exposing hole 45 is etched by chemical etching to form the cavity 46, and thus, the cross-sectional dimensions and depth of the cavity 46 are not susceptible to variation, and also, the smoothness of the inner wall and the bottom surface can be reliably maintained.

That is, it is possible form the cavity 46 into which it is possible to insert the electronic part EC smoothly, and to mount the electronic part EC onto the bottom surface in a stable manner. Also, it is possible to form the cavity 46 to the maximum depth regardless of the thickness of the substrate, and thus, it is possible to make the substrate having the electronic part EC installed therein as thin as possible.

Also, according to the second manufacturing method, the dummy part 34 has a cross-sectional shape similar to but slightly larger than the cross-sectional shape of the electronic part EC, and thus, it is possible to form the cavity 46 to have a cross-sectional shape similar to but slightly larger than the electronic part EC. In other words, it is possible to form the cavity 46 into which the electronic part EC can be inserted in a smoother manner.

Modification Examples of Second Manufacturing Method

Below, modification examples of the second manufacturing method described above will be described.

Modification Example 1

Figure 23:
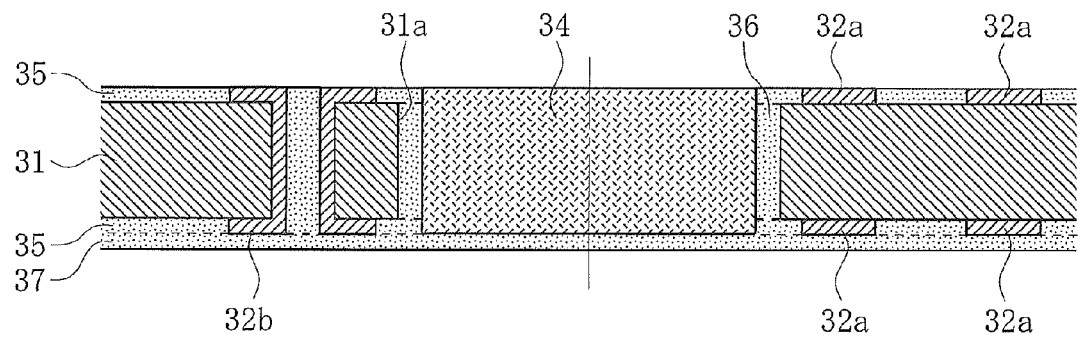
FIG. 23 is a drawing for describing Modification Example 1 of the second manufacturing method.

In the second manufacturing method, a step was used in which the adhesive sheet 33 is bonded on the bottom surfaces of the signal wiring lines 32a and the cylindrical via 32b (refer to FIG. 17), but as shown in FIG. 23, instead of using the adhesive sheet 33, a sheet-shaped material made of a material for the insulating layer 37 that has not yet been cured may be bonded to the bottom surfaces of the signal wiring lines 32a and the cylindrical via 32b, with the bottom surface of the dummy part 34 inserted into the penetrating hole 31a being bonded to the sheet-shaped material and the sheet-shaped material then being cured by heat treatment. In this manner, it is possible to omit the aforementioned step.

Modification Example 2

Figure 24:
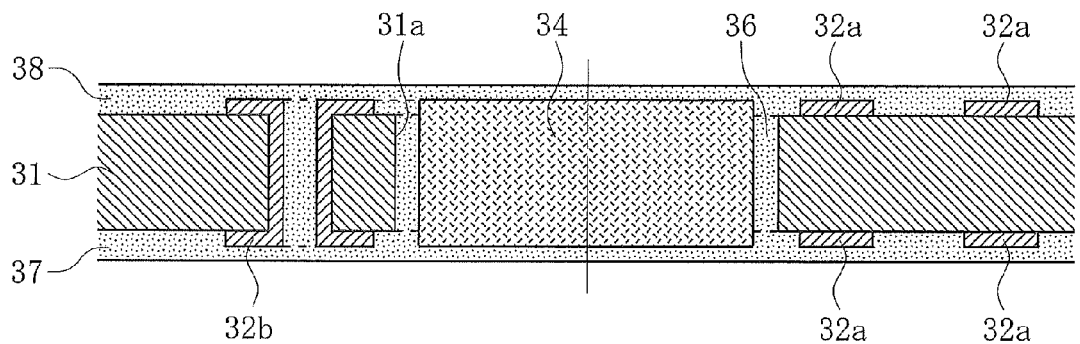
FIG. 24 is a drawing for describing Modification Example 2 of the second manufacturing method.

In the second manufacturing method, a step was used in which the sheet-shaped material made of the material for the insulating layer 35 and the insulating portion 36 that has not yet been cured is bonded to the top surface of the base layer 31, and then the sheet-shaped material is pressed towards the base layer 31 such that a portion thereof fills the ring-shaped gap between the inner wall of the penetrating hole 31a and the outer wall of the dummy part 34 and into the inner hole of the cylindrical via 32b with remaining portions being left remaining in a layer shape on the bottom surface and the top surface of the base layer 31 (refer to FIG. 17). However, as shown in FIG. 24, a step may be taken in which a sheet-shaped material made of the material for the insulating layer 37 that has not yet been cured is bonded onto the bottom surfaces of the signal wiring lines 32a and the cylindrical via 32b and the bottom surface of the dummy part 34 inserted into the penetrating hole 31a, and then a sheet-shaped material made of the material for the insulating layer 38 that has not yet been cured is bonded onto the top surfaces of the signal wiring lines 32a and the cylindrical via 32b, and at least one of the two sheet-shaped materials is pressed towards the base layer 31 such that a portion thereof fills the ring-shaped gap and the inner hole, and the remaining portions are left remaining in a layer shape on the bottom surface and top surface of the base layer 31. In this manner, it is possible to omit the aforementioned step and form the insulating layer 37 and the insulating layer 38 (both of which double as the insulating layers 35) at the same time.

Modification Example 3

In the second manufacturing method, wiring lines (signal wiring lines 32a and flange portion of cylindrical via 32b) are provided in the lower insulating layers (insulating layer 35 and insulating layer 37 on lower side) and wiring lines (signal wiring lines 32a and flange portion of cylindrical via 32b) are provided in the upper insulating layers (insulating layer 35 and insulating layer 38 on upper side), but the wiring lines may be provided in only either of the lower insulating layers and the upper insulating layers. Alternatively, wiring lines may be present in two or more layers by adding the step of forming the insulating layers and the step of forming the wiring lines.

Modification Example 4

In the second manufacturing method, the dummy part 34 is made of copper or a copper alloy (refer to FIG. 17), but even if the dummy part 34 were made of a metal other than copper or a copper alloy such as nickel or a nickel alloy, for example, if an etchant appropriate to removing such metals is used in the step of removing the dummy part described in FIG. 21, a similar step of removing the dummy part can be performed.

Modification Example 5

Figure 25:
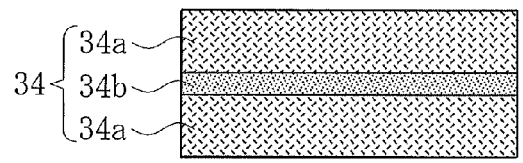
FIG. 25 is a drawing for describing Modification Example 5 of the second manufacturing method.
Figure 26:
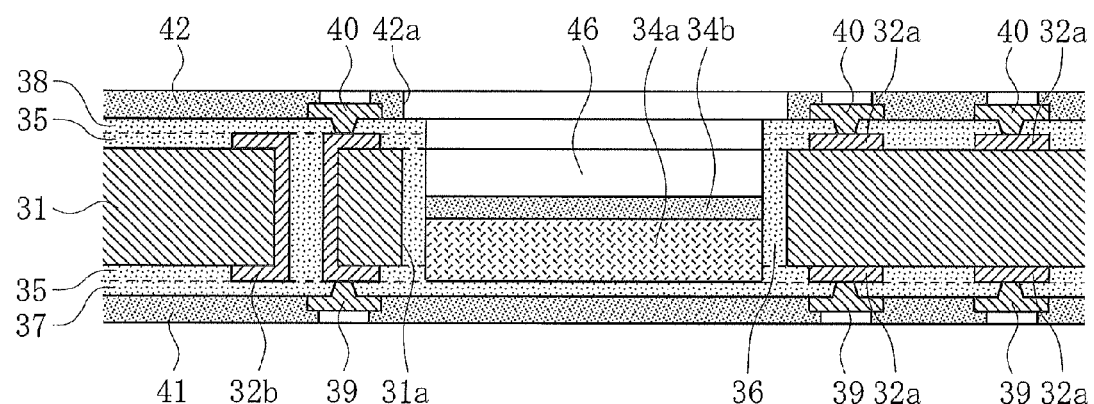
FIG. 26 is a drawing for describing Modification Example 5 of the second manufacturing method.

In the second manufacturing method, the entire dummy part 34 was made of metal (refer to FIG. 17), but a dummy part 34 shown in FIG. 25, or in other words, a dummy part 34 in which an etching resist layer 34b (same material as etching resist layers 43 and 44) is interposed between two metal blocks 34a, each of which fulfills the same role as the dummy part, may be used instead. If the dummy part 34 shown in FIG. 25 is used, it is possible to form a shallow cavity 46 as in the substrate with a cavity shown in FIG. 26 with the same steps as the second manufacturing method.

Modification Example 6

Figure 27:
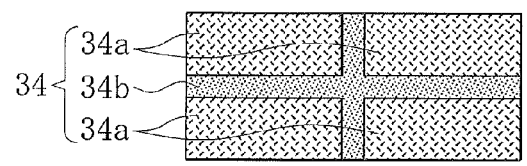
FIG. 27 is a drawing for describing Modification Example 6 of the second manufacturing method.
Figure 28:
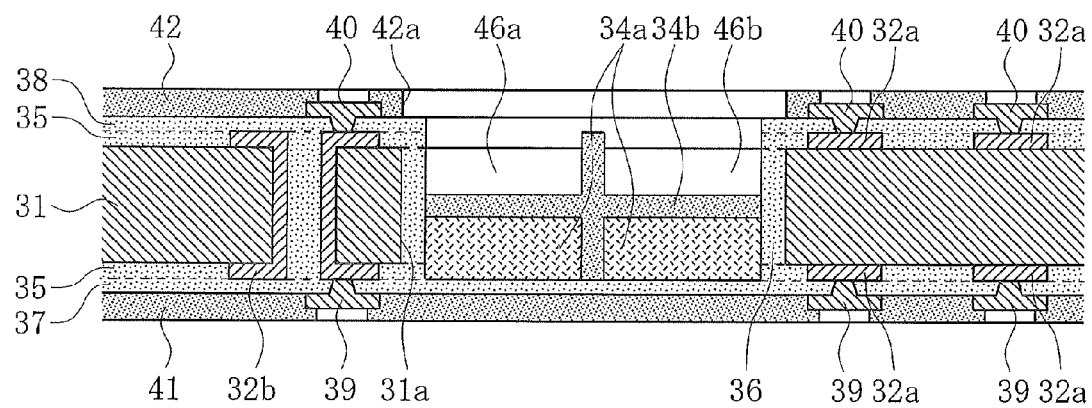
FIG. 28 is a drawing for describing Modification Example 6 of the second manufacturing method.
Figure 29:
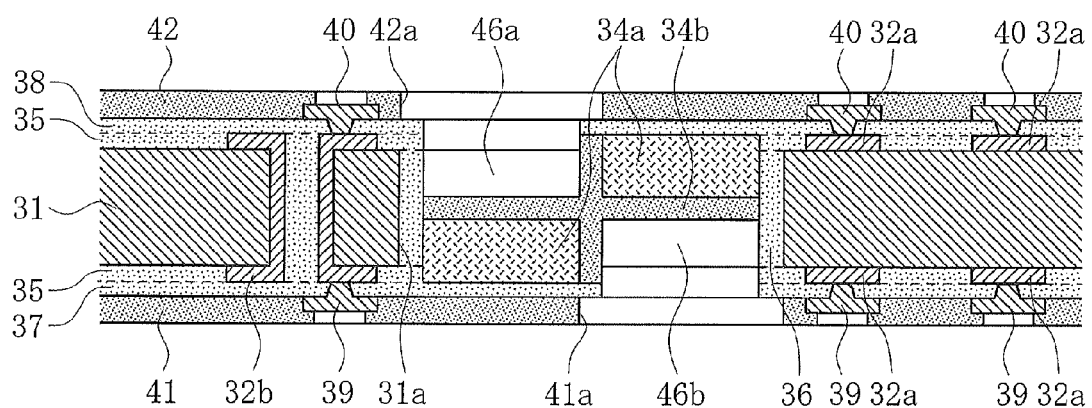
FIG. 29 is a drawing for describing Modification Example 6 of the second manufacturing method.

In the second manufacturing method, the entire dummy part 34 was made of metal (refer to FIG. 17), but a dummy part 34 shown in FIG. 27, or in other words, a dummy part 34 in which etching resist layers 34b (same material as etching resist layers 43 and 44) are interposed between four metal blocks 34a, each of which fulfills the same role as the dummy part, may be used instead. If the dummy part 34 shown in FIG. 27 is used, it is possible to form two shallow cavities 46a and 46b that are adjacent to each other as in the substrate with a cavity shown in FIG. 28 with the same steps as the second manufacturing method. Also, if the dummy part 34 shown in FIG. 27 is used, two cavities 46a and 46b having a shallow depth as in the substrate with a cavity shown in FIG. 29 can be formed on the top surface and bottom surface of the substrate by substantially the same steps as the second manufacturing method.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a substrate having a cavity for installing an electronic part therein, comprising:
    forming a penetrating hole for inserting a dummy part made of metal, said penetrating hole penetrating through a base layer;
    inserting the dummy part in the penetrating hole such that a ring-shaped gap is formed between an inner wall of the penetrating hole and an outer wall of the dummy part;
    filling said ring-shaped gap with an insulating portion made of synthetic resin;
    forming a lower insulating layer made of synthetic resin onto a bottom surface of the base layer so as to cover a bottom surface of the dummy part and so as to be continuous with the insulating portion;
    forming an upper insulating layer made of synthetic resin onto a top surface of the base layer so as to cover a top surface of the dummy part and so as to be continuous with the insulating portion;
    forming, by mechanical cutting, an exposing hole in either the upper insulating layer to expose the top surface of the dummy part or the lower insulating layer to expose the bottom surface of the dummy part; and
    chemically etching the dummy part so as to remove said dummy part exposed through the exposing hole, thereby forming said cavity.

2. The method of manufacturing a substrate having a cavity according to claim 1, wherein the base layer is made of metal.

3. The method of manufacturing a substrate having a cavity according to claim 1, wherein the base layer is made of synthetic resin.

4. The method of manufacturing a substrate having a cavity according to claim 1, wherein a cross-section of the dummy part is larger than a cross-section of the electronic part.

5. The method of manufacturing a substrate having a cavity according to claim 2, wherein a cross-section of the dummy part is larger than a cross-section of the electronic part.

6. The method of manufacturing a substrate having a cavity according to claim 3, wherein a cross-section of the dummy part is larger than a cross-section of the electronic part.

7. The method of manufacturing a substrate having a cavity according to claim 1, further comprising forming a wiring line inside at least one of the upper insulating layer and the lower insulating layer.

8. The method of manufacturing a substrate having a cavity according to claim 2, further comprising forming a wiring line inside at least one of the upper insulating layer and the lower insulating layer.

9. The method of manufacturing a substrate having a cavity according to claim 3, further comprising forming a wiring line inside at least one of the upper insulating layer and the lower insulating layer.

10. The method of manufacturing a substrate having a cavity according to claim 4, further comprising forming a wiring line inside at least one of the upper insulating layer and the lower insulating layer.

11. The method of manufacturing a substrate having a cavity according to claim 5, further comprising forming a wiring line inside at least one of the upper insulating layer and the lower insulating layer.

12. The method of manufacturing a substrate having a cavity according to claim 6, further comprising forming a wiring line inside at least one of the upper insulating layer and the lower insulating layer.

* * * * *